Figure 6:
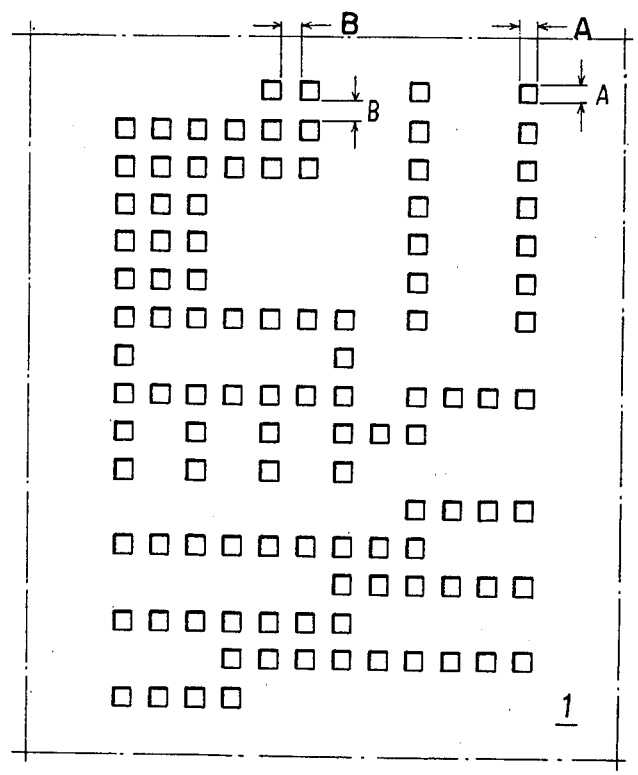

United States Patent [19]

Stengl et al.

[11] 4,370,556

[45] Jan. 25, 1983

[54] SELF-SUPPORTING MASK, METHOD FOR PRODUCTION AS WELL AS USE OF SAME

[75] Inventors: Gerhard Stengl, Purkersdorf; Hans Löschner, Vienna, both of Austria

[73] Assignee: Rudolf Sacher Gesellschaft m.b.H., Vienna, Austria

[21] Appl. No.: 217,064

[22] Filed: Dec. 16, 1980

[30] Foreign Application Priority Data

Dec. 27, 1979 [AT] Austria .................................. 8153/79

[51] Int. Cl.³ ................................................ G01J 1/00
[52] U.S. Cl. .................................. 250/503.1; 250/505.1
[58] Field of Search ...................... 250/503, 505, 492.2, 250/492.3; 430/5

[56] References Cited

U.S. PATENT DOCUMENTS

| 3,227,880 | 1/1966 | Wideröe | 250/505 |
| 3,529,960 | 9/1970 | Sloan | 430/327 |
| 3,742,230 | 6/1973 | Spears et al. | 250/510 |
| 4,037,111 | 7/1977 | Allan et al. | 430/5 |
| 4,101,782 | 7/1978 | Seliger | 250/492.3 |
| 4,171,489 | 10/1979 | Adams et al. | 250/510 |

FOREIGN PATENT DOCUMENTS 1163495 9/1969 United Kingdom .

Primary Examiner—Bruce C. Anderson
Attorney, Agent, or Firm—Martin A. Farber

[57] ABSTRACT

Mask for use in the treatment of substrates with an image-forming medium. The mask foil is thermally prestressed by the frame at the temperature of use. For this purpose, the material of the frame has a higher coefficient of thermal expansion than the material of the mask foil. A method of manufacturing such masks includes the step wherein the mask foil is mounted in the frame at a temperature which lies below the temperature of use.

17 Claims, 10 Drawing Figures

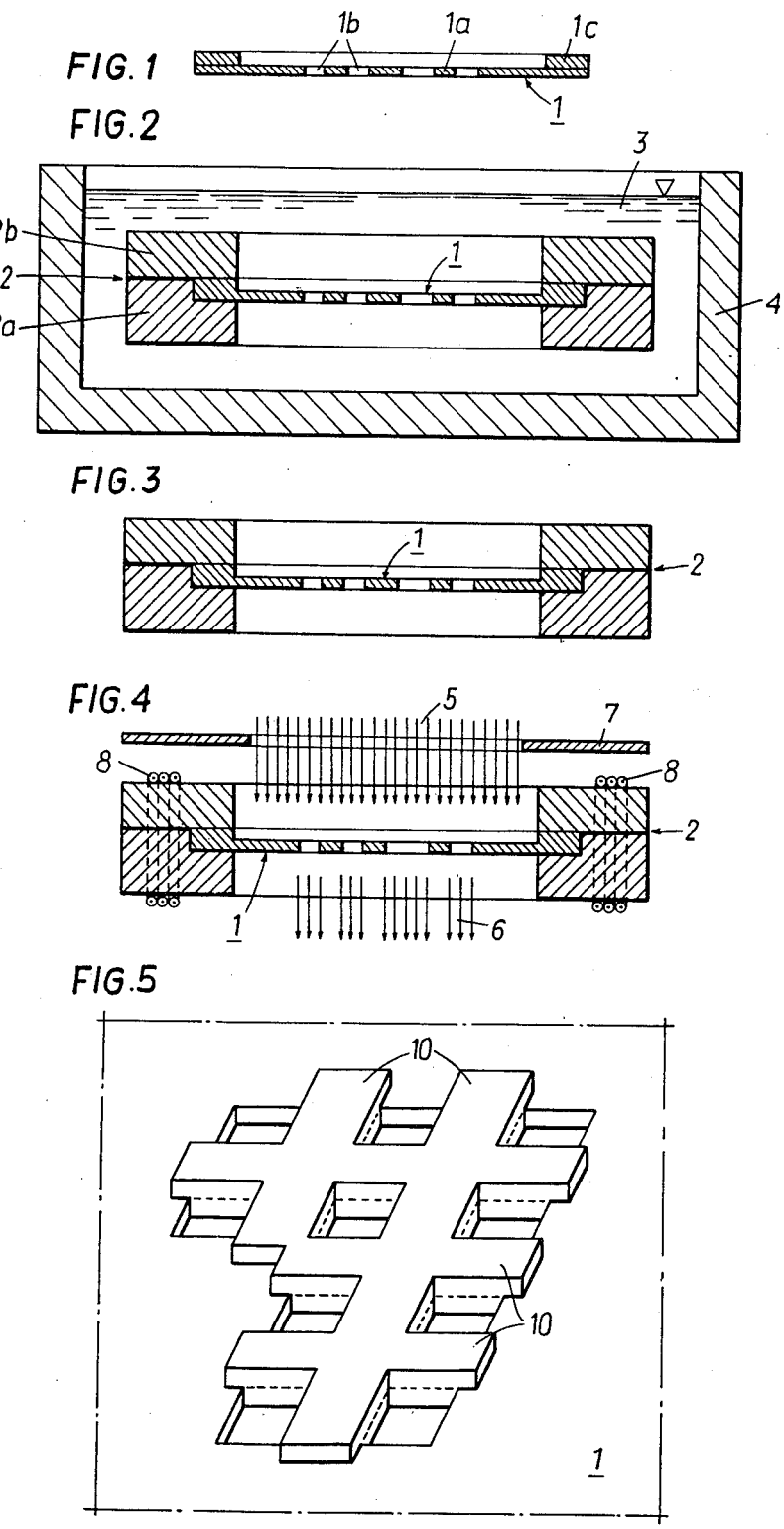

SELF-SUPPORTING MASK, METHOD FOR PRODUCTION AS WELL AS USE OF SAME

The present invention relates to a self-supporting mask for use in the treatment of substrates by radiation or by a stream of particles (image-forming medium) having a mask foil, fastened to a frame, the foil having at least one region which is previous to the image-forming medium.

Such masks are used in the treatment of substrates by irradiation or a stream of particles in order that certain regions of the substrate will not be exposed to the action of the particles or beam.

In order to be able to handle masks having thin mask foils of large area, it is already known to support the mask foils by a frame, in which connection reference may be had, by way of illustration, to U.S. Pat. No. 4,101,782 and to West German AS 2 512 086.

The frame may, in this connection, consist of the same material as the mask foil itself. However, for technological reasons a different material is frequently selected, such as, for instance, a glass frame for the holding of a nickel mask foil in accordance with West German AS No. 2 512 086, or an aluminum frame for mounting a mask foil of aluminum oxide in accordance with U.S. Pat. No. 4,101,782.

A mask foil should not have any uneven places after its manufacture and should be free of local internal stresses, as is also required in U.S. Pat. No. 3,271,488.

As material for the mask, nickel is frequently used (West German AS No. 2 512 086) since mask structures of very high precision can be produced from this material by means of galvanic techniques.

The known mounting of a mask foil in a frame is, however, not by itself sufficient to avoid deformation of the mask foil and thus errors in the transmission of the structure, under the action of particles or rays.

Thus, for instance, in one known method of electron projection (B. Lischke, K. Anger, W. Munchmeyer, A. Oelmann, J. Frosien, R. Schmitt and M. Sturm. "Investigations about High-Performance Electron-Microprojection Systems," 8th Int. Conf. on Electron and Ion Beam Science and Technology, Seattle, USA, May 1978) mask foils of nickel of a diameter of 50 mm and a thickness of about 1 $\mu$m are used. The action on these mask foils of electron bombardment of 1 $\mu$A/cm$^2$ leads, in accordance with this article, to a sag of the mask foil by 350 $\mu$m. This sag leads to a defect in the transmission of the structure. In order to keep this error less than 0.5 $\mu$m, sufficient time for the cooling of the mask must be provided after brief electron bombardment. Thus the maximum rate of exposure must be limited to 1 cm$^2$/second in the plane of the mask.

In another known method (H. Bohlen, J. Greschner, W. Kulche and P. Nehmiz, "Electron Beam Step and Repeat Proximity Printing, " 8th Int. Conf. on Electron and Ion Beam Science and Technology, Seattle, USA, May 1978; H. Bohlen, J. Greschner and P. Nehmiz, "Silicon Supported EB Proximity Masks," 8th Int. Conf. on Electron and Ion Beam Science and Technology, Seattle, USA, May 1978) the mask foil consists of p-silicon and is held by a ring of n-silicon. The area of the mask is indicated as about 5.5×5.5 mm$^2$. A thin layer of chromium and gold was also applied to the mask foil so that there was a mask thickness of about 3 $\mu$m. In such masks no sagging of the foil was noted up to a temperature of 120° C. the experimental results for 1:1 electron projection reported show that the mask foil can be acted on, without deformation, by a 12.5 keV electron beam (diameter 1 mm) with a current intensity of 10 $\mu$A if the electron beam is scanned sufficiently rapidly line by line over the mask foil.

In the published method of 1:1 ion projection through a mask of alumina or thin silicon with a gold absorber layer (D. B. Rensch, R. L. Seliger, G. Csanky, R. D. Olney and H. L. Stover, "Ion-Beam Lithography for IC Fabrication with Submicrometer Features," J. Vac. Sci. Techn. 16(6), 1897—1900, Nov./Dec. 1979; R. L. Seliger and P. A. Sullivan, "Ion Beams Promise Practical Systems for Scbmicrometer Water Lithography," Electronics, pp. 142–146, Mar. 27, 1980) upon ion exposure with a high rate of passage, the heating-up of the mask constitutes the limiting factor (J.Vac.Sci. Techn. 16(6), p. 1900).

One problem with the known self-supporting masks is therefore the deformation of the mask foil when it is exposed to continuous action over all or part of its surface, and in particular action of higher intensity such as necessary for sufficiently short times of exposure.

These deformations—generally a sagging of the masks—lead to defects in the structure transmission. It was therefore also necessary to constantly interrupt the treatment of the substrate so that the mask foil could cool down sufficiently.

The meaningful use of the above-mentioned methods of electron and ion projection is made possible, under the indicated limitations with respect to the load-bearing capacity of the known masks, solely by the high sensitivity of electron-sensitive or ion-sensitive lacquers.

The object of the present invention is to assure the planarity and structural fidelity of the mask even in the case of continuous as well as substantially stronger action on the entire mask foil by particles or beams.

This result is achieved, in accordance with the invention, in the manner that the mask foil is thermally prestressed at its temperature of use by forces exerted by the frame on the mask foil, the forces resulting from the fact that the coefficient of thermal expansion of the frame is higher than the coefficient of thermal expansion of the material of the mask foil.

The undulations and/or deformations of the mask foil which occur in the case of the known masks and which result in an inaccurate reproduction do not occur with the mask of the present invention. Since the mask foil is always thermally prestressed due to the measures proposed by the invention at its temperature of use, the heating up of the mask foil merely leads to a partial cancellation of the initial stress produced by the frame, without the proportions of the mask thereby changing of deformations such as undulations, buckling or the like occuring in the mask. Only after the complete cancelling out of the prestress can deformations of the mask foil occur. It is obvious that when the mask of the invention is used, considerably higher intensities of the image-forming medium are possible than was previously the case. Even continuous action on the mask foil is possible without deformation, since with the mask of the invention the temperature of the mask foil can considerably exceed the temperature of the frame without resulting in a sagging of the foil or a change in the mask structures.

By selection of the materials for the frame and the mask foil, in which connection the temperature difference between temperature of manufacture of the mask and the temperature which the foil assumes upon bombardment or irradiation can be taken into consideration, it is possible to adjust the stress of the mask foil suitably, when using the mask of the invention. The materials are to be so selected furthermore that the prestressing of the mask foil takes place within the elastic range of the material of the mask foil, so that there can be no plastic deformation of the mask foil.

It is not essential for the mask foil to be prestressed at room temperature. It is essential, however, that the mask foil be prestressed at the temperature of use, i.e. the temperature which the mask assumes under bombardment by the stream of particles or under the action of the irradiation.

One preferred embodiment of the invention is characterized by the fact that the mask foil consists, as is known, of metal, for instance nickel, and that the frame consists, as is known, of aluminum. This combination of materials is particularly favorable since the coefficient of thermal expansion of aluminum is about twice as great as that of nickel.

One of the possible uses of the mask of the invention is in an ion projection system (R. Sacher, G. Stengl, P. Wolf and R. Kaitna, "Novel Microfabrication Process without Lithography using an Ion-Projection System," Proc. 5th Int. Conf. Ion. Impl. in Semiconductors and Other Materials, Boulder, Colorado, Aug. 8–13, 1976; G. Stengl, R. Kaitna, H. Loeschner, P. Wolf and R. Sacher, "Ion-Projection-System for IC Production," 15th Symp. Electron Ion and Photon Beam Techn., Boston, Mass., USA, May/June 1979; G. Stengl, R. Kaitna, H. Loeschner, P. Wolf and R. Sacher, "Ion-Projection-System for Microstructure Fabrication," Proc. Microcircuit Engineering '79, RWTH Aachen, Federal Republic of Germany, Sept. 25–27, 1979) in which accelerated ions impinge on a mask and a partial beams of ions are produced corresponding to the openings in the mask. These individual beams of ions are further accelerated and fed to an ion-optically reducing or enlarging system, whereby a reduced or enlarged ion picture of the openings in the mask foil is produced on the substrate which is to be worked.

The mask of the invention can also be used in electron projection systems and in projection systems in which electromagnetic waves such as ultraviolet light or x-rays are used.

The mask of the invention can also be used in systems in which thin layers are applied in structural regions predetermined by a mask. This is the case, for instance, upon vapor deposition of metal layers through a stencil or in the production of thin-film components.

Further possibilities of use consist in the silkscreen printing process, for instance for thick film technology.

Electron and particularly ion projection systems are acquiring increasing importance for the production of microstructures in the semiconductor industry. The development of large area self-supporting masks is very important for such systems.

By galvanic methods such as described in R. Sacher, G. Stengl, P. Wolf and R. Kaitna, "Novel Microfabrication Process without Lithography using an Ion-Projection System," Proc. 5th Int. Conf. Ion. Impl. in Semiconductors and Other Materials, Boulder, Colorado, Aug. 8–13, 1976; A. Politycki and A. Meyer, Herstellung freitragender Metallmikrostrukturen für elektronenoptische Geräte (Fabrication of Self-Supporting Metal Microstructures for Electron Optical Instruments), Siemens Forsch, u. Entwickl.-Ber., Volume 4, No. 3, 162, 1975, it has become possible to produce self-supporting metal masks having opening and web widths in the $\mu$m and sub-$\mu$m range. Very fine grids of Ni, Cu, Ag or Au of 2000 lines per inch (web width 6.3 $\mu$m) are obtainable from the Buckbee-Mears Company, 245 East Sixth Street, St. Paul, Minn. 55101, USA. The thickness of the mask is between 2.5 $\mu$m and 5 $\mu$m and the mask area is up to $11 \times 11$ cm$^2$.

The possibility of producing nickel grids with web widths of up to 0.5 mm is known from A. Politycki and A. Meyer, Herstellung freitragender Metall-Mikrostrukturen für elektronenoptische Geräte (Fabrication of Self-Supporting Metal Microstructures for Electron Optical Instruments), Siemens Forsch,-u. Entwickl. -Ber. Volume 4, No. 3, 162, 1975; A . Politycki and A. Meyer, "Demagnifying Electron Projection with Grid Masks," Siemens Forsch, -u. Entwickl. -Ber. Volume 7, No. 1, 28, 1978. One of the methods of fabrication is described in West German AS No. 2 512 086.

The advantage of projection systems (A. N. Broers, "A Review of High-Resolution Microfabrication Techniques," Inst. Phys. Conf. Ser. No. 40, pp. 155–167, 1978; see page 168) over scanning lithography systems can be fully utilized only with the present invention. By the possibility of continuous action on the mask foil which is obtained in accordance with the invention the output and thus the economy of projection systems can by optimalized. The invention makes possible such a loading of the mask foil in ion projection systems (G. Stengl, R. Kaitna, H. Loeschner, P. Wolf. and R. Sacher, "Ion-Projection System for IC Production," 15th Symp. Electron, Ion and Photon Beam Techn., Boston, Mass. USA. May/June 1979; G. STengl, R. Kaitna, H. Loeschner, P. Wolf and R. Sacher, "Ion-Projection System for Microstructure Fabrication," Proc. Microcircuit Engineering '79, RWTH Aachen, Federal Republic of Germany, Sept. 25–27, 1979) that structurings of inorganic, semiconductive and metallic layers become possible with ion exposure times (H$^+$, D$^+$ or He$^+$ ions) of typically one second. With organic layers, the required exposure times for one structure region are 1/100 to 1/1000 second.

The previously known self-supporting grid masks consist of a mask foil of uniform thickness, the mask foil being held by a frame. The mask structures in such grid makes are ordinarily of different size and are not distributed uniformly over the surface. Due to the non-homogeneous absorption of image-forming medium over the foil this leads to local distortions in the case of mask foils which are held by a frame. In the case of such self-supporting grid masks of uniform thickness, the local deformations are very substantially reduced by the thermal prestressing of the mask foil in accordance with the invention. In order to entirely eliminate local deformations of grid masks of any given mask structure which have been thermally prestressed in accordance with the invention, the transmitting regions in the mask foil can, in accordance with the invention, have a grid structure with preferably known square grid openings and the webs of the grid structure can be developed thicker than the mask foil. It is preferred, in this connection, for the reinforcement of the webs to consist of a material which has the same coefficient of thermal expansion as the material of the mask foil. In accordance with one particularly simple embodiment, the reinforcements of the web consist of the same material as the mask foil, for instance nickel. In this way, the loss in strength due to the openings which are present is compensated for by a corresponding increase in thickness of the webs of the grid. The reinforcements of the grid webs have the effect of holding the density of the lines of force in the region of the webs within the order of magnitude of the density of the lines of force in the mask foil, so that the mask foil is uniformly prestressed in all regions.

A method in which the mask foil is inserted at a temperature lying below the temperature of use of the mask foil into the frame which is at the same temperature and in which the prestressing of the mask foil is possibly brought about by intentional heating of the frame has proven suitable for the fabricating of the mask.

Therefore, in the production of the mask of the invention, the mask foil can be inserted at a temperature lying below the temperature of use of the mask foil into the frame which is at the same temperature. As a result of the temperature difference between the clamping temperature and the temperature of use of the mask, the prestressing is thereby produced, it being possible to also bring about or increase the prestressing by intentional heating of the frame.

The value of the clamping temperature will be selected in accordance with the thermal load to which the mask will be subjected by the particle bombardment or by the irradiation. It is frequently advisable to cool the mask foil and the frame to a temperature which lies below room temperature and then insert the cooled mask foil into the cooled frame. The cooling can be effected, for instance, by placing the frame and the mask foil in ice water or liquid nitrogen.

The planarity and structural fidelity of the thermally prestressed mask is readily assured upon homogeneous heating of the mask foil by the image-forming medium. If the stream of particles or radiation which impinges on the mask is not sufficiently homogeneous then, uniform heating of the mask foil can be obtained, within the scope of the invention, in a method for the masking of substrates with the use of the mask of the invention by uniformly heating the mask foil, for instance, by irradiation, possibly with infrared rays, in order to compensate for non-homogeneous action on the mask foil of the image-forming medium. By this auxiliary source of radiation, the non-homogenity of the loading of the mask foil which is brought about by the image-forming medium is counteracted. One such auxiliary source can, for instance, be an annular infrared radiator. When ions are used as image-forming medium, the compensation for non-homogeneous loading can be effected by a suitably scanned electron beam of low energy or by scanning the ion beam itself.

Figure 7:
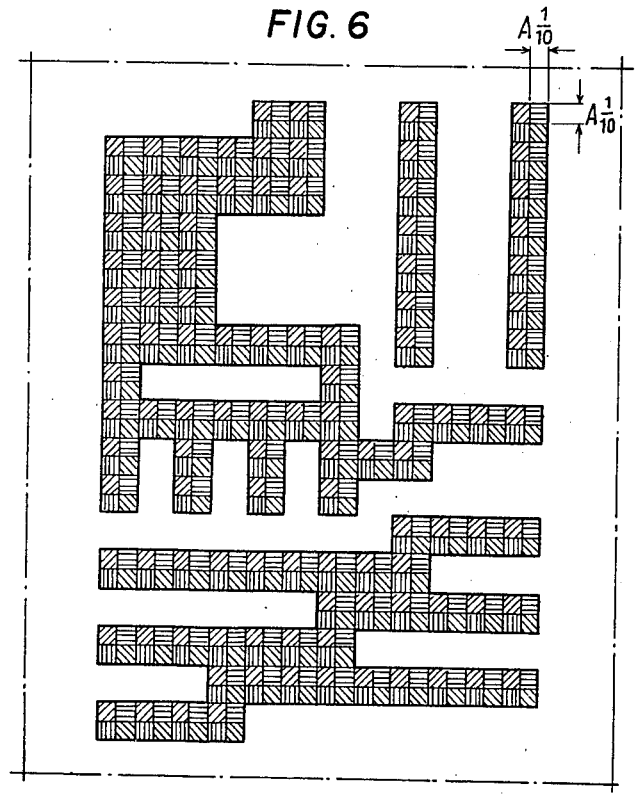
Figure 8:
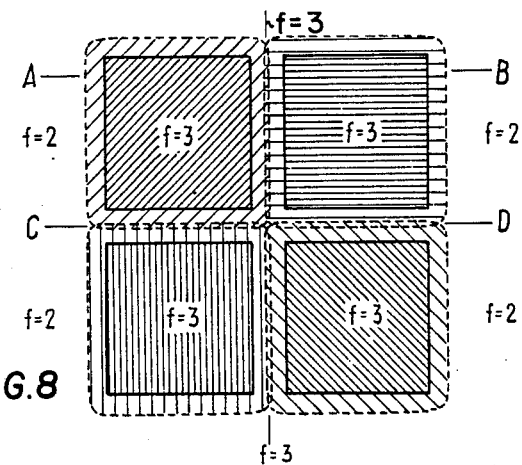
Figure 8A:
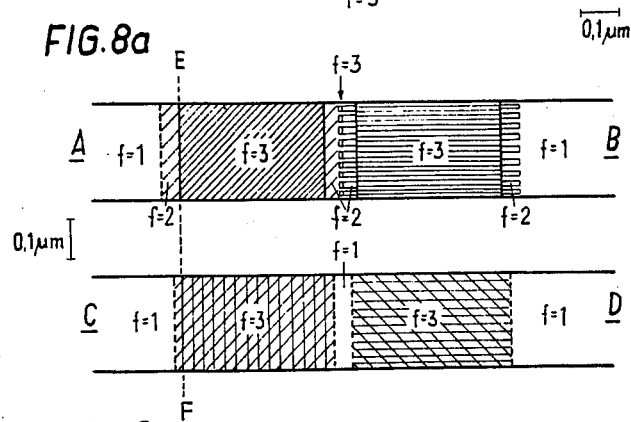
Figure 9:
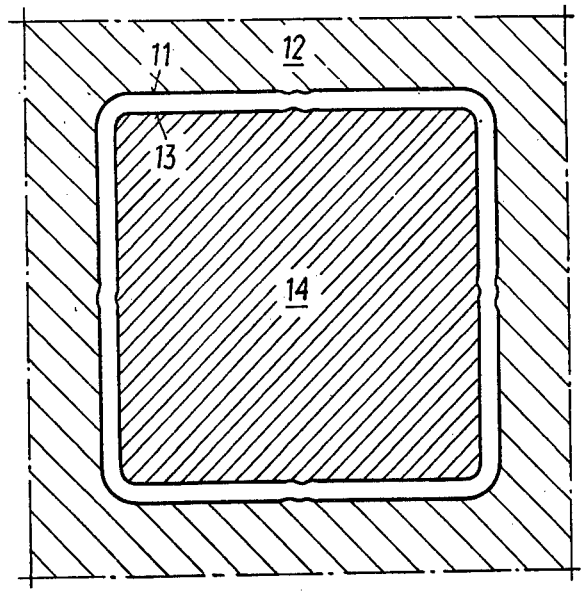

Further details and features of the invention will become evident from the following description, given with reference to the accompanying diagrammatic drawings, in which FIGS. 1 to 3 show individual stages of the production of a thermally prestressed mask, FIG. 4 shows the mask upon use, FIG. 5 shows a mask, the openings of which are passed through by a grid structure, FIG. 6 shows the arrangement of the square openings in a metal mask for the quadruple implantation of the oxide structures in FIG. 7, FIG. 7 shows the idea of the quadruple implantation of oxide layers with square basic units, FIG. 8 and FIG. 8a show an assumed damage distribution with oxide structures implanted alongside of each other, and FIG. 9 shows an edge structure, developed, assuming an isotropic etching process, after the etching of the damage distribution of FIG. 8 down to silicon.

The production of a mask will first of all be described with reference to FIGS. 1 to 3.

It is assumed that a mask foil 1 (FIG. 1) is present, the mask webs 1a and mask openings 1b in the case of a self-supporting mask producing the entire mask structures.

For easier handling, the mask foil may have a reinforcement frame 1c, which may consist of the same material as the mask foil.

The production of mask foils having structures of high precision is possible by several technical methods and does not form an object of the present invention.

As shown in FIG. 2, the mask foil 1 is now inserted in the frame part 2a at a temperature which is below the subsequent temperature of use.

If the temperature of use of the mask lies within the region of room temperature, then the mask foil 1 and frame 2 should be cooled, for instance, by placing them in a container 4 containing a cold liquid or a cold gas 3. A container of ice water or of liquid nitrogen is, for instance, suitable for this. The mask foil 1 is then clamped fast in the cold environment 3 by means of the frame part 2b to the frame part 2a so that the mask foil 1 is fixed on all its edges in the frame 2. A square mask 1 and accordingly a square frame 2 are ordinarily used.

In accordance with the invention, the frame 2 consists of a material whose coefficient of thermal expansion is higher than that of the material of the mask. In the case of mask foils of nickel, a frame of aluminum can be used since the coefficient of thermal expansion of aluminum is about twice that of nickel.

After the clamping has been effected in accordance with FIG. 2, the arrangement consisting of mask foil 1 and frame 2 is slowly heated to room temperature (FIG. 3). In this connection the frame exerts increasing forces on the mask foil, as a result of which the mask foil is thermally prestressed. By the selection of the material of mask foil 1 and frame 2 and of the clamping temperature assurance is had that this prestressing will take place within the elastic range of the material of the mask so that no plastic deformation or even tearing of the mask foil 1 can occur upon the use of the mask.

FIG. 4 shows an illustrative arrangement of such a prestressed mask in a projection appratus. The mask foil 1 is illuminated by the image-forming medium 5 (electromagnetic radiation or a stream of particle of electrons, ions or neutrons or vapor-deposition or sputter particles), the individual rays 6 being produced in accordance with the mask structures and being projected onto the substrate reduced, magnified or else 1:1, depending on the existing projection system. A diaphragm 7 prevents the frame 2 from being also impinged by the image-forming medium 5. The frame 2 is held in this connection at constant temperature, for instance by controlled heating by means of a heating wire 8. A change in the dimensions of the frame 2 indirectly by the image-forming medium 5 is prevented by these measures.

By the heating of the frame 2 the thermal prestressing of the mask foil can also be increased. In certain cases of use under low load of the foil 1 by the image-forming medium 5, the mask foil 1 can be inserted into the frame 2 at room temperature, a sufficient thermal prestressing of the mask foil 1 being obtained by heating the frame 2.

The irradiating of the mask foil with the image-forming medium 5 now leads to a heating of the mask foil 1. By the thermal prestressing of the mask foil in accordance with the invention, the temperature of the mask foil 1 which is produced thereby may considerably exceed the temperature of the frame 2 without the foil sagging or there being any change in the mask structures.

In most cases, for instance upon a transfer of the structure with constant reproduction ratio, it is advantageous to keep the frame of the mask at a substantially constant temperature.

In the case of the mask of the invention, the design of the mask can advantageously be such that all openings (5×5 μm) of the mask (thickness, for instance 2.5 μm) are passed through by a grid structure, as shown on an example in FIG. 5.

The loss in strength due to the presence of the openings is compensated for by a corresponding increase in thickness of the webs 10 of the grid, as shown in FIG. 5. In this way the mask foil is uniformly prestressed in all regions.

The mask design can be based on a regular basic grid having square openings. One example of a design is shown in FIG. 6, square openings (of side length A) with grid webs (of width B) being present.

The design is expressed merely by the number and arrangement of the square openings. This mask design can be tansferred in the desired structural regions to the substrate by a quadruple exposure with the image-forming medium. This is shown in FIG. 7 for the illustrative design of FIG. 6 in the event of a 10:1 reducing ion projection. In FIG. 7 the regions implanted in the individual steps are characterized by different hatchings. With such grid masks the problem present in self-supporting masks of the dropping out of structures is eliminated, i.e. a structuring which is self-contained can be obtained on the substrate to be worked (see FIG. 7, left). This is very important for most masking layers of a semiconductor design.

The X and Y displacements for the quadruple exposure have been carried out up to now by deflection of the particle or ray pattern. See: M. B. Heritage, P. E. Stuckert and V. DiMilia, "A Solution to the Mask 'Stencil Problem' in Electron Projection Microfabrication," Proc. 7th Int. Conf. Electron and Ion Beam Science and Techn., Washington, May 1976.

B. Lischke, K. Anger, J. Frosien, A. Oehlmann, and H. Schuster-Woldan, "Pattern Generation by 1:1 Shadow-Printing," Int. Conf. on Microlithography, Paris, June 1977.

One possibility consists in effecting the corresponding X and Y movements for the quadruple exposure with the substrate which is to be worked.

Because of the mechanical tolerances which must be maintained, a corresponding movement of the mask relative to the substrate is more advantageous than movement of the substrate to be worked, particularly in the case of reduction projection systems.

The X and Y movements of the mask or substrate necessary for the quadruple exposure can be effected sufficiently accurately and rapidly by piezoelectric displacement transducers. The irradiation times are determined by, for instance, a mechanical shutter system and coordinated with the movements of the mask.

With the grid masks described it is possible to produce structures whose width and length are a multiple of the basic unit 2·A·M in which A is the side length of the square openings in the nickel mask and their distances apart and M is the scale of reproduction (frequently M=10). The distances between the structures are also multiples of this basic unit.

In order to obtain on the substrate to be worked structure edges which are as linear as possible, the following method can be employed. The basic grid is so selected in this method that the width of the grid webs B is greater than the side length A of the square openings. The value of the difference B-A will depend on the properties of the reproduction apparatus, on the selection of the image-forming medium, and on the nature of the substrate to be worked. This method will be explained in further detail on an example of structuring with an ion projector.

It is assumed here that in a silicon dioxide of a thickness of 0.25 μm a square opening in the nickel mask of 4 μm by 4 μm is to be projected by implantation with an ion projector with reduction of 10:1 into a square of 0.4 μm×0.4 μm (FIG. 8). Of the silicon dioxide within this region it is assumed that the switching rate (f) increased by ion implantation reaches a value of 3. Within this region the oxide is etched three times faster in dilute hydrochloric acid than in non-implanted regions. In addition to this implantation region it is assumed that due to the properties of the imaging ion projector and in particular due to a lateral dispersing of the ions within the substrate to be structured, an area around the square region of 0.4×0.4 μm will also be changed. In FIG. 8 a region of 0.05 μm with an etching rate of 2 is assumed. Corresponding cross sections of the detect distributions are shown in FIG. 8a. Furthermore, in the case of the defect distribution of FIG. 8a it is assumed that the superimposing of oxide regions with f=2 leads to a defect distribution with f=3 (this corresponds to a saturation of the ion-induced defects).

The etch behavior of this damage distribution which has been assumed in FIG. 3 was determined by graphical construction. In this way there is obtained the edge distribution of the structure etched in $SiO_2$ which is shown in FIG. 9. In FIG. 9 the edge 11 is the oxide edge on the silicon-dioxide surface 12 and the edge 13 is the oxide edge on silicon 14.

The measure of making the grid webs correspondingly wider than the side length of the square openings of the mask therefore makes possible, upon quadruple exposure, a substantially higher degree o linearity of structures which have been implanted combined.

The optimal difference B-A for a given imaging apparatus, for the image-forming medium selected and for the substrate to be structured can be determined in each case in simple fashion.

The invention also relates to grid masks in which the width of the grid webs is smaller than the side length of the opening square. With sufficiently small web width it is possible to effect a single exposure with such a mask, as described in A. Politycki and A Meyer, "Demagnifying Electron Projection with Grid Masks," Siemens Forsch.- u. Entwickl. -Ber. Volume 7 (1978), No. 1, pp-28-33. In this way structures finer by about a factor of two than in the quadruple exposure method can be obtained.

Of course, in the case of such masks the width of the grid webs must be so slight that a continuous structuring is obtained by irradiation over onto the substrate to be worked.

In the case of these masks a corresponding reinforcement of the grid webs can also be provided in order to compensate for the loss in strength, as a result of which a uniform thermal prestressability can also be obtained. For example, the webs can be simply thickened as compared with the rest of the region of the mask.

An optimal selection of the width of the grid webs in such masks is also important. The width of the grid webs of such masks should not be selected as small as possible from a manufacturing standpoint but is rather to be adapted to the properties of the image-forming apparatus, the image-forming medium and the substrate to be worked.

Thus for the above-assumed example of structuring (FIG. 8a), masks having square openings with a side length of 4 $\mu$m and a web width of 0.9 $\mu$m would be selected as optimal for a single exposure. In the case of masks with grid webs of smaller width it would not be possible in this case to obtain the same measure of linearity of the etched structures as in FIGS. 8a and 9.

In all embodiments of the mask of the invention the mask foil may consist, for instance, of metal or of plastic, possibly bearing a metal coating.

We claim:

1. In a self-supporting mask for use in the treatment of substrates by irradiation or by a stream of particles constituting an image-forming medium having a mask foil fastened to a frame, the mask foil having at least one transparent region which is transparent to the image-forming medium, and a region which is opaque to the image-forming medium, the improvement wherein
    said mask foil is thermally prestressed at a predetermined temperature of use by predetermined forces exerted by said frame on said mask foil, said mask foil and said frame being at a predetermined assembly temperature level below said predetermined temperature of use when said mask foil and said frame are fastened together,
    and wherein said mask foil and said frame are made of respectively different materials such that the coefficient of thermal expansion of the material of said frame is greater than the coefficient of thermal expansion of the material of said mask foil to permit said mask foil to remain thermally prestressed at the predetermined temperature of use.

2. The mask according to claim 1, wherein said mask foil is made of metal and said frame is made of aluminum.

3. The mask according to claim 2, wherein said metal is nickel.

4. The mask according to claim 1 or 2, wherein
    the mask foil has a grid structure defining transparent grid openings and having webs, said webs of the grid structure being reinforced as compared with the thickness of the mask foil.

5. The mask according to claim 4, wherein said grid openings are square.

6. The mask according to claim 3, further comprising reinforcement means for the webs comprises a material which has the same coefficient of thermal expansion as said material of said mask foil.

7. The mask according to claim 4, wherein
    said reinforcement means for the webs comprises the same said material of said mask foil.

8. The mask according to claim 7, wherein
    said material of said reinforcement means and said mask foil is nickel.

9. The mask according to claim 1, further comprising
    means for heating the frame above the assembly temperature to maintain a uniform thermal prestress level in said mask foil.

10. A method for making a self supporting mask for use with an image forming medium, comprising the steps of
    forming a mask foil,
    forming a frame from a material having a greater coefficient of thermal expansion than that of the mask foil,
    allowing the frame and the mask foil, while unassembled, to assume an assembly temperature level that is below the temperature of use for the supporting mask when the supporting mask is exposed to the image forming medium, and
    fastening the mask foil to the frame at the assembly temperature level to assure that the mask foil will be prestressed by the frame at the use temperature.

11. A method of masking substrates with respect to a stream of particles or irradiation with the self-supporting mask according to claim 10, comprising the steps of
    uniformly heating said mask foil in order to equalize non-homogeneous loading to the mask foil by the image-forming medium.

12. The method as set forth in claim 11, wherein
    said uniformly heating step is performed with radiation.

13. The method as set forth in claim 11, wherein said radiation is infrared rays.

14. The method as set forth in claim 10, wherein
    the frame and the mask foil are placed at the assembly temperature level by being immersed in ice water.

15. The method as set forth in claim 10, wherein
    the frame and the mask foil are placed at the assembly temperature level by being immersed in nitrogen liquid.

16. The method as set forth in claim 10, wherein
    the frame and the mask foil are placed at the assembly temperature level by placing the frame and the mask foil in a room and permitting the frame and the mask foil to assume room temperature.

17. The method as set forth in claim 10, further comprising
    heating the frame with a heater to place the frame at a temperature level above the assembly temperature level, to cause the frame to effect a minimum uniform prestress level in the mask foil.

* * * * *